US012796296B2

(12) United States Patent
Yuan

(10) Patent No.: US 12,796,296 B2
(45) Date of Patent: Nov. 10, 2026

(54) DISPLAY DEVICE AND MANUFACTURING METHOD THEREOF

(71) Applicant: Magnolia White Corporation, Tokyo (JP)

(72) Inventor: Ze Yuan, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 294 days.

(21) Appl. No.: 18/764,407

(22) Filed: Jul. 5, 2024

(65) Prior Publication Data

US 2025/0017086 A1 Jan. 9, 2025

(30) Foreign Application Priority Data

Jul. 7, 2023 (JP) ................................ 2023-112439

(51) Int. Cl.
*H10K 59/80* (2023.01)

(52) U.S. Cl.
CPC ....... *H10K 59/879* (2023.02); *H10K 59/8792* (2023.02)

(58) Field of Classification Search
CPC .. G02B 3/0012; G02B 3/0043; G02B 3/0087; G02B 19/0066; H10K 59/1201; H10K 59/122; H10K 59/126; H10K 59/879; H10K 59/878; H10K 59/8791; H10K 59/8792; H10K 59/38; H10K 59/871; H10K 50/858; H10K 50/865; H10K 71/00
See application file for complete search history.

(56) References Cited

U.S. PATENT DOCUMENTS

| | | | | |
|---|---|---|---|---|
| 11,914,103 B2 * | 2/2024 | Kim | G02B 1/04 | |
| 2011/0062476 A1 * | 3/2011 | Tobise | G02B 3/0031 | 257/98 |
| 2012/0223873 A1 * | 9/2012 | Ohta | H10K 59/35 | 345/76 |
| 2014/0027724 A1 * | 1/2014 | Lim | H10K 59/38 | 257/40 |
| 2014/0361264 A1 * | 12/2014 | Choi | H10K 59/1201 | 257/40 |
| 2016/0013449 A1 | 1/2016 | Cui et al. | | |
| 2016/0064694 A1 * | 3/2016 | Choi | H10K 59/35 | 257/40 |
| 2016/0087018 A1 * | 3/2016 | Shim | H10K 59/122 | 257/40 |

(Continued)

FOREIGN PATENT DOCUMENTS

JP 2016-018785 A 2/2016

*Primary Examiner* — Eduardo A Rodela
(74) *Attorney, Agent, or Firm* — XSENSUS LLP

(57) ABSTRACT

According to one embodiment, a display device includes a lower electrode, a rib, an organic layer, an upper electrode, a support body having a first surface and a second surface, a first lens provided on the first surface immediately above the lower electrode and formed into a convex shape, an overcoat layer which covers the first lens, a second lens provided on the second surface immediately above the rib and formed into a convex shape, and a light-shielding layer which covers the second lens. The first lens includes at least a first layer which is in contact with the first surface and has a first refractive index, and a second layer which has a second refractive index higher than the first refractive index and overlaps the first layer.

15 Claims, 10 Drawing Sheets

(56) References Cited

U.S. PATENT DOCUMENTS

| | | | | |
|---|---|---|---|---|
| 2019/0251318 A1* | 8/2019 | Jung | .................. | G06V 40/1306 |
| 2022/0102416 A1* | 3/2022 | Chinen | ................. | H10F 30/223 |
| 2022/0293657 A1* | 9/2022 | Chou | ................... | G02B 3/0018 |
| 2024/0260326 A1* | 8/2024 | Lee | ...................... | H10K 59/122 |

* cited by examiner

DISPLAY DEVICE AND MANUFACTURING METHOD THEREOF

CROSS-REFERENCE TO RELATED APPLICATION

This application is based upon and claims the benefit of priority from Japanese Patent Application No. 2023-112439, filed Jul. 7, 2023, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a lower electrode, an upper electrode which faces the lower electrode, and an organic layer located between the lower electrode and the upper electrode and including a light emitting layer.

In the display element described above, a technique which efficiently extracts the light generated in the light emitting layer to the outside is required. For example, a technique which applies an inner extraction layer formed on the inner surface of a substrate facing the display element and an outer extraction layer formed on the outer surface of the substrate is known.

DETAILED DESCRIPTION

Figure 1:
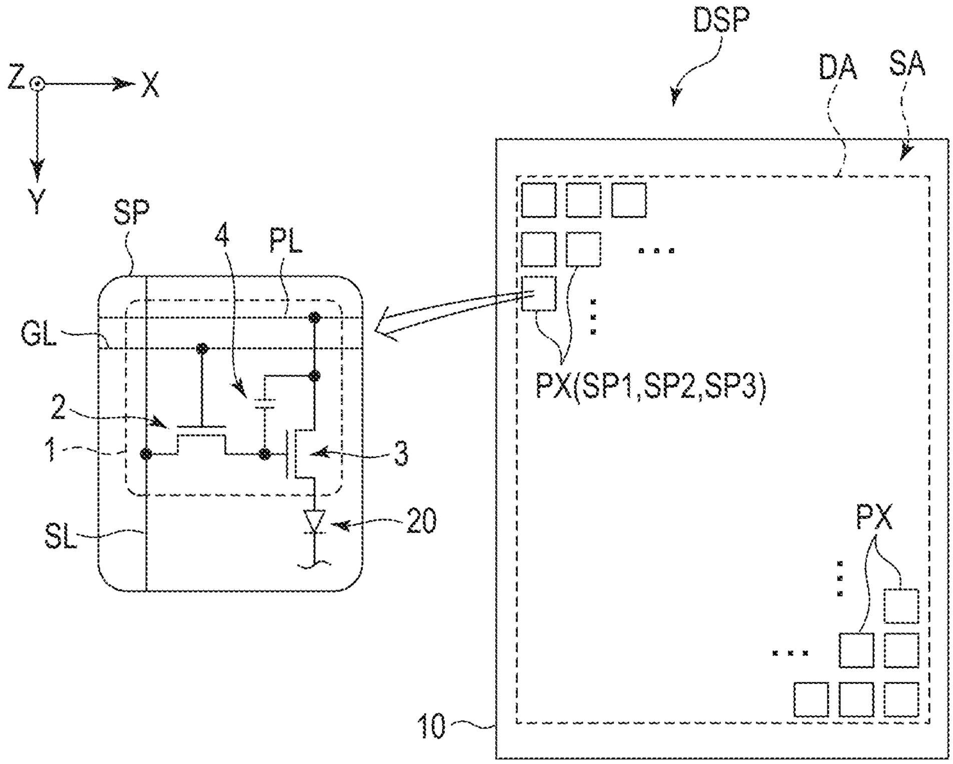
FIG. 1 is a diagram showing a configuration example of a display device.

Embodiments described herein aim to provide a display device in which the light extraction efficiency is improved and the reflection of external light can be prevented, and a manufacturing method thereof.

In general, according to one embodiment, a display device comprises a substrate, a lower electrode provided above the substrate, a rib which covers a peripheral portion of the lower electrode, an organic layer provided on the lower electrode and including a light emitting layer, an upper electrode provided on the organic layer, a support body provided above the upper electrode and having a first surface which faces the lower electrode, and a second surface on a side opposite to the first surface, a first lens provided on the first surface immediately above the lower electrode and formed into a convex shape, an overcoat layer which covers the first lens, a second lens provided on the second surface immediately above the rib and formed into a convex shape, and a light-shielding layer which covers the second lens. The first lens comprises at least a first layer which is in contact with the first surface and has a first refractive index, and a second layer which has a second refractive index higher than the first refractive index and overlaps the first layer.

According to another embodiment, a manufacturing method of a display device comprises forming a first lens on a first surface of a support body, covering the first lens with an overcoat layer, forming a second lens on a second surface of the support body, forming a light-shielding layer which covers the second lens, and attaching the overcoat layer to an insulating layer provided above a display element. The forming the first lens includes at least forming a first layer on the first surface by using a material having a first refractive index, and forming a second layer on the first layer by using a material having a second refractive index which is higher than the first refractive index.

The embodiments can provide a display device in which the light extraction efficiency is improved and the reflection of external light can be prevented, and a manufacturing method thereof.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When various elements are viewed parallel to the third direction Z, the appearance is defined as a plan view. When terms indicating the positional relationships of two or more structural elements, such as "on", "above" "between" and "face", are used, the target structural elements may be directly in contact with each other or may be spaced apart from each other as a gap or another structural element is interposed between them. The positive direction of the Z-axis is referred to as "on" or "above".

The display device of the present embodiment is an organic electroluminescent (EL) display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the embodiment, the substrate 10 is rectangular as seen in plan view. It should be noted that the shape of the substrate 10 in plan view is not limited to a rectangle and may be another shape such as a square, a circle or an oval.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3. It should be noted that the combination of subpixels is not limited to three elements. The combination may consist of two elements or may consist of four or more elements by adding subpixel SP4 etc., to subpixels SP1 to SP3.

Each subpixel SP comprises a pixel circuit 1 and a display element 20 driven by the pixel circuit 1. The pixel circuit 1 comprises a pixel switch 2, a drive transistor 3 and a capacitor 4. Each of the pixel switch 2 and the drive transistor 3 is, for example, a switching element consisting of a thin-film transistor.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

Although not described in detail, a terminal for connecting an IC chip and a flexible printed circuit is provided in the surrounding area SA.

Figure 2:
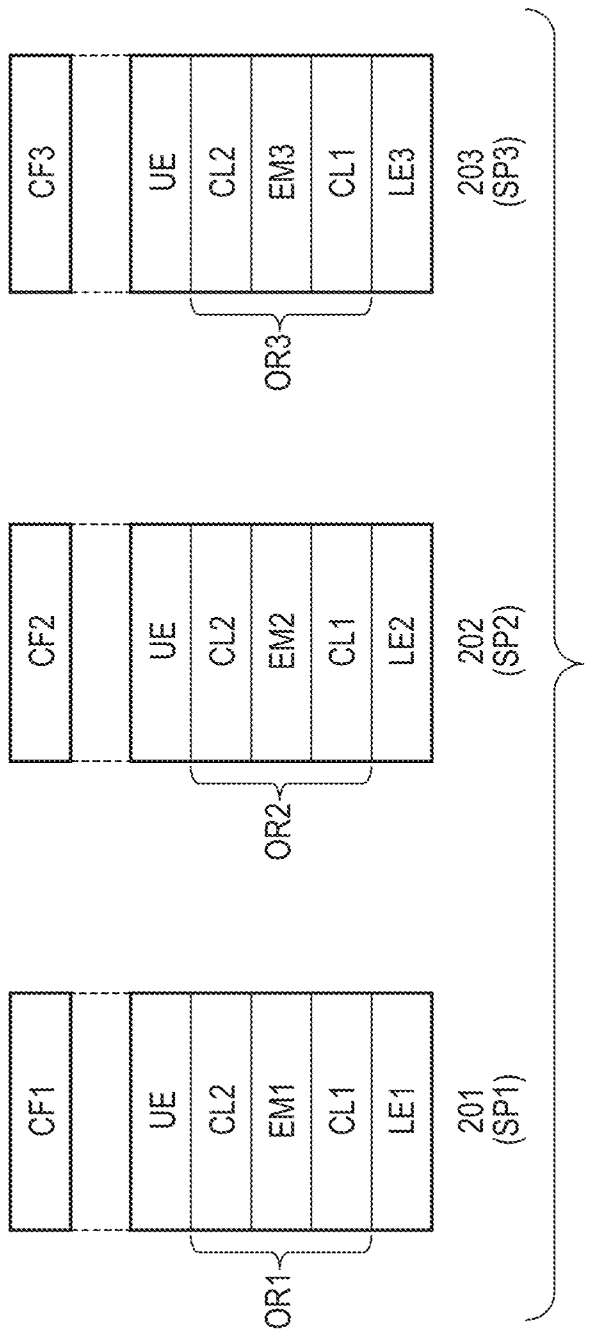
FIG. 2 is a diagram showing a configuration example of subpixels SP1, SP2 and SP3.

FIG. 2 is a diagram showing a configuration example of subpixels SP1, SP2 and SP3.

Subpixels SP1, SP2 and SP3 comprise display elements 201, 202 and 203, respectively, as the display elements 20. In the example shown in the figure, subpixel SP1 comprises a color filter CF1 facing the display element 201. Subpixel SP2 comprises a color filter CF2 facing the display element 202. Subpixel SP3 comprises a color filter CF3 facing the display element 203. It should be noted that at least one of these color filters CF1, CF2 and CF3 may be omitted.

The display element 201 comprises a lower electrode LE1, an organic layer OR1 including a light emitting layer EM1, and an upper electrode UE. The organic layer OR1 is provided between the lower electrode LE1 and the upper electrode UE. The light emitting layer EM1 is formed of a material which emits light exhibiting the first color. The color filter CF1 is colored in the first color.

The display element 202 comprises a lower electrode LE2, an organic layer OR2 including a light emitting layer EM2, and the upper electrode UE. The organic layer OR2 is provided between the lower electrode LE2 and the upper electrode UE. The light emitting layer EM2 is formed of a material which emits light exhibiting the second color. The color filter CF2 is colored in the second color.

The display element 203 comprises a lower electrode LE3, an organic layer OR3 including a light emitting layer EM3, and the upper electrode UE. The organic layer OR3 is provided between the lower electrode LE3 and the upper electrode UE. The light emitting layer EM3 is formed of a material which emits light exhibiting the third color. The color filter CF3 is colored in the third color.

For example, the lower electrodes LE1, LE2 and LE3 correspond to the anodes of the display elements, and the upper electrode UE corresponds to the cathodes of the display elements or a common electrode.

In the example shown in the figure, each of the organic layers OR1, OR2 and OR3 includes a common layer CL1 and a common layer CL2.

The common layer CL1 has, for example, a hole injection layer, a hole transport layer and an electron blocking layer. The common layer CL1 is provided between the lower electrode LE1 and the light emitting layer EM1, between the lower electrode LE2 and the light emitting layer EM2 and between the lower electrode LE3 and the light emitting layer EM3.

The common layer CL2 has, for example, an electron injection layer, an electron transport layer and a hole blocking layer. The common layer CL2 is provided between the light emitting layer EM1 and the upper electrode UE, between the light emitting layer EM2 and the upper electrode UE and between the light emitting layer EM3 and the upper electrode UE.

Figure 3:
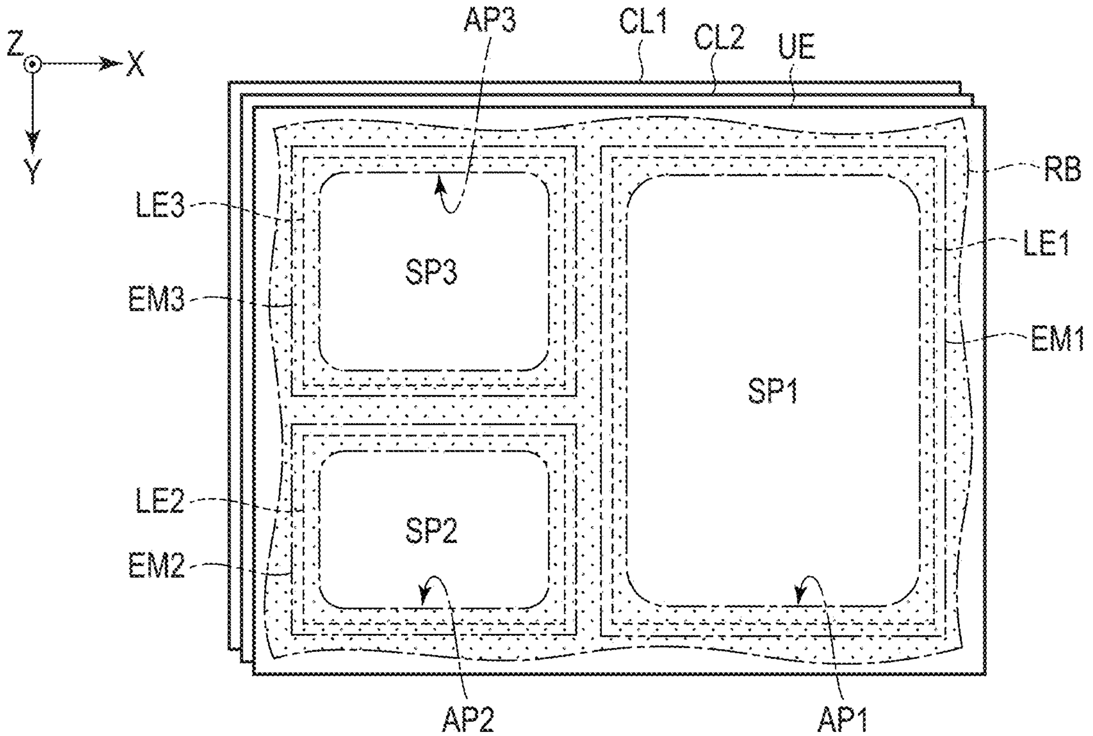
FIG. 3 is a diagram showing an example of the layout of subpixels SP1, SP2 and SP3.

FIG. 3 is a diagram showing an example of the layout of subpixels SP1, SP2 and SP3.

In the example shown in the figure, subpixel SP1 and subpixel SP2 are arranged in the first direction X. Subpixel SP1 and subpixel SP3 are arranged in the first direction X. Subpixel SP2 and subpixel SP3 are arranged in the second direction Y.

When subpixels SP1, SP2 and SP3 are provided in line with this layout, a column in which subpixels SP2 and SP3 are alternately provided in the second direction Y and a column in which a plurality of subpixels SP1 are provided in the second direction Y are formed in the display area DA. These columns are alternately arranged in the first direction X.

It should be noted that the layout of subpixels SP1, SP2 and SP3 is not limited to the example of FIG. 3. As another example of the layout, subpixels SP1, SP2 and SP3 may be arranged in order in the first direction X.

A rib RB indicated by dashed lines has apertures AP1, AP2 and AP3 in subpixels SP1, SP2 and SP3, respectively. In the example shown in the figure, the areas of the apertures AP1, AP2 and AP3 are different from each other. The area of the aperture AP2 is less than that of the aperture AP1, and the area of the aperture AP3 is less than that of the aperture AP2.

In subpixel SP1, both the lower electrode LE1 indicated by broken lines and the light emitting layer EM1 indicated by double chain lines overlap the aperture AP1 as seen in plan view. The lower electrode LE1 is electrically connected to the pixel circuit 1 (see FIG. 1) of subpixel SP1. The peripheral portion of each of the lower electrode LE1 and the light emitting layer EM1 overlaps the rib RB.

In subpixel SP2, both the lower electrode LE2 and the light emitting layer EM2 overlap the aperture AP2 as seen in plan view. The lower electrode LE2 is electrically connected to the pixel circuit 1 of subpixel SP2. The peripheral portion of each of the lower electrode LE2 and the light emitting layer EM2 overlaps the rib RB.

In subpixel SP3, both the lower electrode LE3 and the light emitting layer EM3 overlap the aperture AP3 as seen in plan view. The lower electrode LE3 is electrically connected to the pixel circuit 1 of subpixel SP3. The peripheral portion of each of the lower electrode LE3 and the light emitting layer EM3 overlaps the rib RB.

The lower electrodes LE1, LE2 and LE3 are spaced apart from each other. The light emitting layers EM1, EM2 and EM3 are spaced apart from each other. The common layer CL1, the common layer CL2 and the upper electrode UE overlap each of the apertures AP1, AP2 and AP3 and overlap the rib RB.

It should be noted that the outer shape of each of the apertures AP1, AP2 and AP3, the lower electrodes LE1, LE2 and LE3 and the light emitting layers EM1, EM2 and EM3 does not necessarily reflect the accurate shape.

Figure 4:
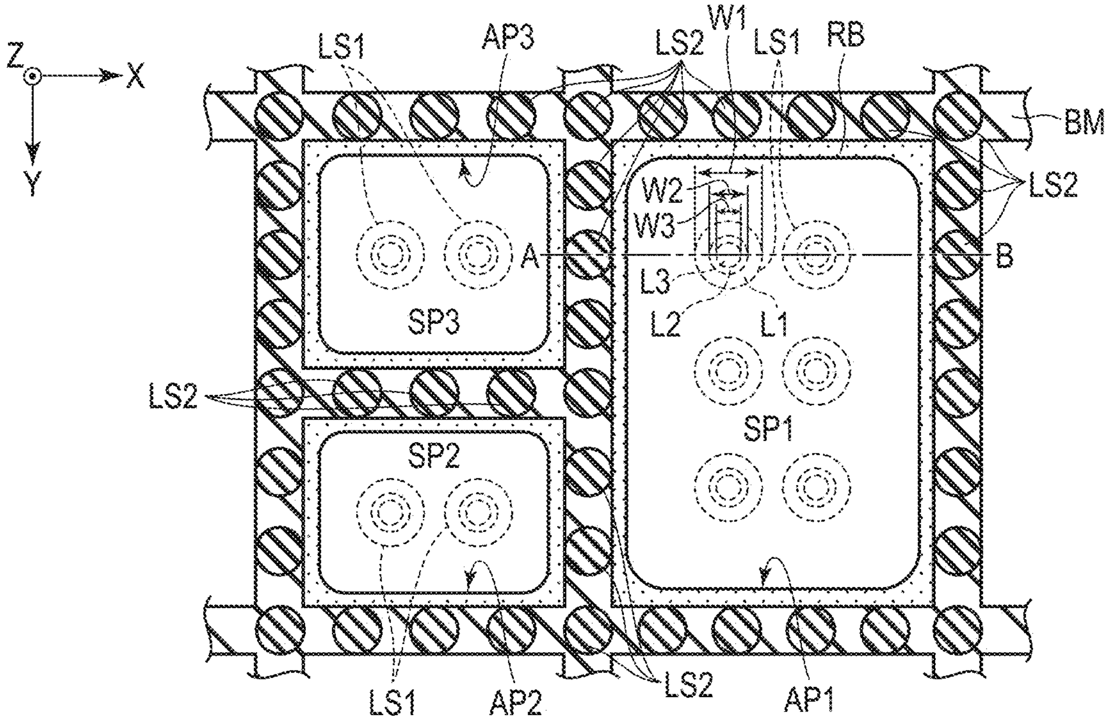
FIG. 4 is a diagram showing an example of the layout of first lenses LS1 and second lenses LS2.

FIG. 4 is a diagram showing an example of the layout of first lenses LS1 and second lenses LS2. It should be noted that the illustrations of the lower electrode, organic layer, upper electrode, etc., constituting the display element of each subpixel are omitted in FIG. 4.

A light-shielding layer BM overlaps the rib RB and is formed into a grating shape which surrounds each of the apertures AP1, AP2 and AP3.

In each of subpixels SP1, SP2 and SP3, all of the first lenses LS1 indicated by the broken lines are surrounded by the rib RB as seen in plan view. In other words, in subpixel SP1, the first lenses LS1 overlap the aperture AP1. In subpixel SP2, the first lenses LS1 overlap the aperture AP2. In subpixel SP3, the first lenses LS1 overlap the aperture AP3.

Each first lens LS1 is formed into a circular shape as seen in plan view. Each first lens LS1 is a multilayer body consisting of at least two layers. In the example shown in the figure, each first lens LS1 has a first layer L1, a second layer L2 which overlaps the first layer L1, and a third layer L3 which overlaps the second layer L2. The first layer L1, the second layer L2 and the third layer L3 are formed of materials different from each other. The outer edge of the first layer L1, the outer edge of the second layer L2 and the outer edge of the third layer L3 are formed concentrically as seen in plan view. The outer edge of the third layer L3 is located in the center of each first lens LS1. The outer edge of the second layer L2 is located outside the third layer L3. The outer edge of the first layer L1 is located outside the second layer L2. Regarding the width parallel to the first direction X, width W2 of the second layer L2 is greater than width W3 of the third layer L3, and width W1 of the first layer L1 is greater than width W2 of the second layer L2 ($W3<W2<W1$).

In the example shown in the figure, all of the first lenses LS1 have the same diameter. At least one of the first lenses LS1 may have a diameter different from that of the other first lenses LS1.

The second lenses LS2 indicated by the solid lines overlap the rib RB and the light-shielding layer BM as seen in plan view. Each of the apertures AP1, AP2 and AP3 is surrounded by a plurality of second lenses LS2. In addition, a plurality of second lenses LS2 are provided between the aperture AP1 and the aperture AP2, between the aperture AP1 and the aperture AP3 and between the aperture AP2 and the aperture AP3.

Each second lens LS2 is formed into a circular shape as seen in plan view. Each second lens LS2 is, for example, a single-layer body formed of a single material. In the example shown in the figure, all of the second lenses LS2 have the same diameter. At least one of the second lenses LS2 may have a diameter different from that of the other second lenses LS2. It should be noted that the diameter of each second lens LS2 may be equal to that of each first lens LS1 or may be different from that of each first lens LS1.

Figure 5:
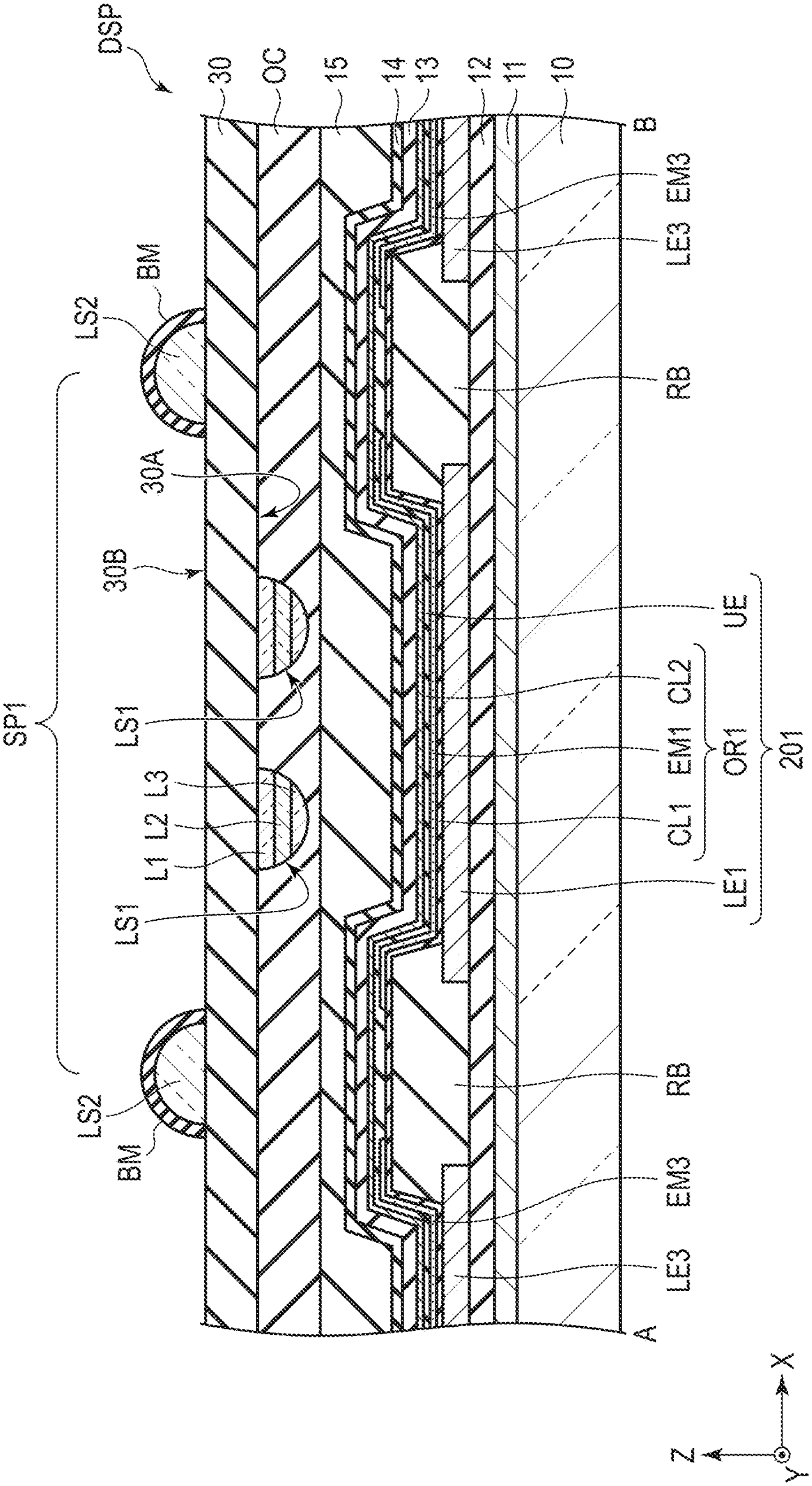
FIG. 5 is a cross-sectional view showing a configuration example of the display device DSP along the A-B line of FIG. 4.

FIG. 5 is a cross-sectional view showing a configuration example of the display device DSP along the A-B line of FIG. 4. Here, this specification mainly explains the sectional structure of subpixel SP1. The example shown here corresponds to an example in which the color filter is omitted. It should be noted that the color filter may be provided above the display device DSP shown in the figure.

A circuit layer 11 is provided on the substrate 10. The circuit layer 11 includes various circuits such as the pixel circuit 1 shown in FIG. 1 and various lines such as the scanning line GL, the signal line SL and the power line PL. The circuit layer 11 is covered with an insulating layer 12. The insulating layer 12 includes an organic insulating layer which planarizes the irregularities formed by the circuit layer 11.

The lower electrode LE1 of the display element 201 is provided on the insulating layer 12. The other lower electrodes LE2 and LE3 are also provided on the insulating layer 12. The lower electrode LE1 is, for example, a multilayer body including an oxide conductive layer formed of indium tin oxide (ITO) etc., and a metal layer formed of silver etc.

The rib RB is provided on the insulating layer 12. The rib RB covers the peripheral portion of the lower electrode LE1. The rib RB is an insulating layer and is formed of an organic material or an inorganic material.

The common layer CL1 is provided on the lower electrode LE1 and the rib RB. The light emitting layer EM1 is located immediately above the lower electrode LE1 and is provided on the common layer CL1. The common layer CL2 is provided on the light emitting layer EM1 and is provided on the common layer CL1 outside the light emitting layer EM1. These common layer CL1, light emitting layer EM1 and common layer CL2 constitute the organic layer OR1 as explained with reference to FIG. 2.

The upper electrode UE is provided on the common layer CL2. The upper electrode UE is formed of, for example, a metal material such as an alloy of magnesium and silver (MgAg).

A cap layer 13 is provided on the upper electrode UE. The cap layer 13 is a transparent multilayer body. The refractive indices of the layers constituting the cap layer 13 are different from each other. This cap layer 13 functions as an optical adjustment layer for adjusting the optical property of the light emitted from the light emitting layer EM1. It should be noted that the cap layer 13 may be omitted.

A sealing layer 14 is provided on the cap layer 13. The sealing layer 14 is formed of, for example, a transparent inorganic material such as silicon nitride (SiNx), silicon oxide (Siox) or silicon oxynitride (SiON).

An insulating layer 15 is provided on the sealing layer 14. The insulating layer 15 is formed of a transparent organic material.

An overcoat layer OC is provided on the insulating layer 15. For example, the overcoat layer OC is attached to the insulating layer 15. This overcoat layer OC is formed of a transparent organic material.

A support body 30 has a first surface (lower surface) 30A which faces the display element 201 including the lower electrode LE1, and a second surface (upper surface) 30B on a side opposite to the first surface 30A.

The first lenses LS1 are provided on the first surface 30A immediately above the lower electrode LE1 and are formed into a convex shape toward the display element 201. The first lenses LS1 are covered with the overcoat layer OC. Each first lens LS1 has a semicircular section as shown in the figure and has a circular outer edge as shown in FIG. 4. Thus, each first lens LS1 is formed into a hemispherical shape.

The first layer L1 of each first lens LS1 has substantially a constant thickness, is in contact with the first surface 30A and has a first refractive index. The second layer L2 has substantially a constant thickness, overlaps the first layer L1, is spaced apart from the first surface 30A and has a second refractive index which is higher than the first refractive index. The third layer L3 has substantially a constant thickness, overlaps the second layer L2, is spaced apart from the first surface 30A and has a third refractive index which is higher than the second refractive index.

Each of the first layer L1, the second layer L2 and the third layer L3 is formed of a transparent organic material. For example, the first layer L1 has the first refractive index of approximately 1.42. The second layer L2 has the second refractive index of approximately 1.49 to 1.5. The third layer L3 has the third refractive index of approximately 1.56 to 1.6.

The overcoat layer OC covers the third layer L3 and is in contact with the peripheral portion of each of the first layer L1 and the second layer L2. This overcoat layer OC should preferably have a refractive index which is less than at least the third refractive index.

It should be noted that each first lens LS1 can consist of at least the first layer L1 and the second layer L2 and may be a multilayer body consisting of four or more layers. In any case, in each first lens LS1, the refractive index of the first layer L1 is the least, and the refractive index increases for each layer with increasing distance from the first layer L1.

Each second lens LS2 is provided on the second surface 30B immediately above the rib RB and is formed into a convex shape on a side opposite to the first lenses LS1. Each second lens LS2 is provided at a position which deviates from the first lenses LS1. These second lenses LS2 are formed of a transparent organic material.

The light-shielding layer BM is provided immediately above the rib RB, is in contact with the second surface 30B and covers the second lenses LS2. This light-shielding layer BM is formed of, for example, an organic material containing black pigment, absorbs external light and prevents undesired reflection of light.

In this display element 201, when a potential difference is formed between the lower electrode LE1 and the upper electrode UE, the light emitting layer EM1 of the organic layer OR1 emits light. The light emitted from the light emitting layer EM1 passes through the cap layer 13, the sealing layer 14, the insulating layer 15 and the overcoat layer OC and is moderately converged or moderately diverges through the first lenses LS1.

In the configuration of providing the light-shielding layer BM in the peripheral portion of the display element 201, the transmittance of the light emitted from the light emitting layer EM1 is increased compared to a configuration in which an antireflective circular polarizer is provided. Thus, a high luminance can be obtained with low power, thereby elongating the life.

Figure 6:
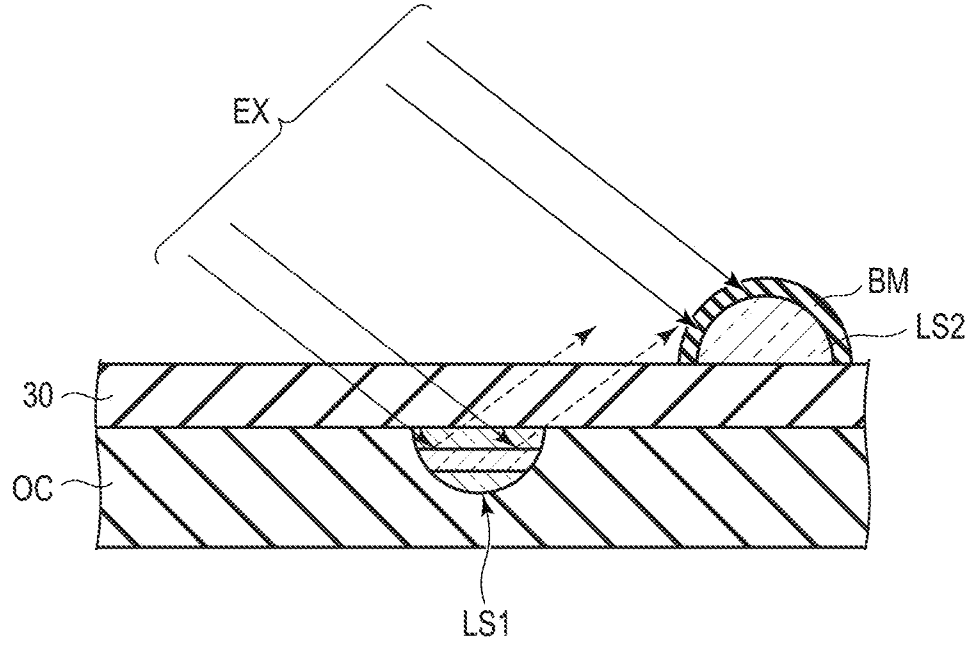
FIG. 6 is a diagram for explaining an effect of an embodiment.

FIG. 6 is a diagram for explaining an effect of the embodiment.

As described above, the first lens LS1 is a multilayer body, and the refractive indices of the layers of the first lens LS1 are different from each other. When external light Ex enters the first lens LS1, the reflectance of external light Ex can be reduced by the effect of the interference of the light reflected on the interfaces between the layers of the first lens LS1.

External light Ex which goes to the second lens LS2 is absorbed by the light-shielding layer BM. The light-shielding layer BM covers the surface of the convex second lens LS2. Therefore, compared to a case where no second lens LS2 is present, the installation area of the light-shielding layer BM is increased, and the reflectance of external light Ex can be further reduced.

Figure 7:
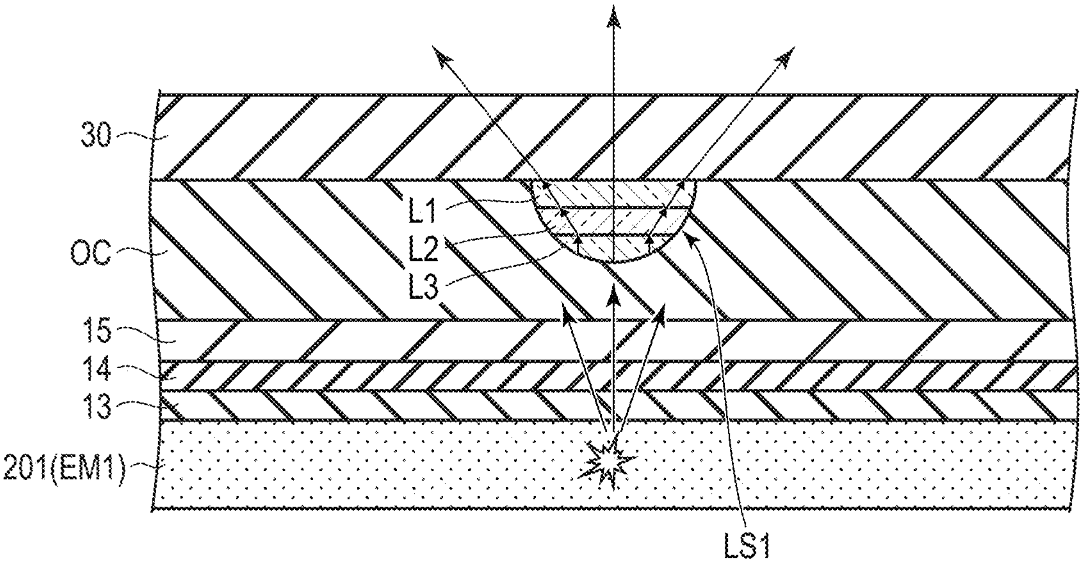
FIG. 7 is a diagram for explaining another effect of the embodiment.

FIG. 7 is a diagram for explaining another effect of the embodiment.

The light emitted in the light emitting layer EM1 of the display element 201 is divergent light. Part of the light is trapped inside the display device.

To solve this problem, in the embodiment, the first lens LS1 having a convex shape toward the display element 201 is provided, and further, the third refractive index of the third layer L3 is higher than the refractive index of the overcoat layer OC. Therefore, the light which reached the first lens LS1 from the display element 201 is refracted on the interface between the overcoat layer OC and the third layer L3 and is moderately converged. In this manner, the light trapped inside the display device is decreased, thereby improving the light extraction efficiency.

The light which passed through the third layer L3 is refracted so as to diverge at the interface between the second layer L2 and the third layer L3 and is refracted so as to diverge at the interface between the first layer L1 and the second layer L2. Thus, the light which passed through the first lens LS1 diverges at a large angle relative to the normal of the display device.

The first lens LS1 is formed into a hemispherical shape. Therefore, in the first lens LS1, the light emission is not limited to a specific direction. Light can isotropically diverge over all directions in an X-Y plane.

Thus, even when the display device DSP is observed at a large observation angle relative to the normal, the light emitted from the display element 201 can be visually recognized. In addition, the light extraction efficiency is improved by the first lenses LS1, and further, a viewing angle at which light having a high luminance can be visually recognized can be enlarged.

The inventor conducted a simulation by comparing the luminance of a comparative example which does not comprise any first lens LS1 with the luminance of the embodiment which comprises the first lenses LS1. It was confirmed that the luminance obtained from the embodiment was higher than that of the comparative example, and in particular, the luminance in the normal direction of the display device was approximately 1.8 times the luminance of the comparative example.

Now, this specification explains the manufacturing method of the display device DSP described above with reference to FIG. 8, FIG. 9A and FIG. 9B. Here, in particular, the manufacturing method of the first lenses LS1 and the second lenses LS2 is explained.

Figure 8:
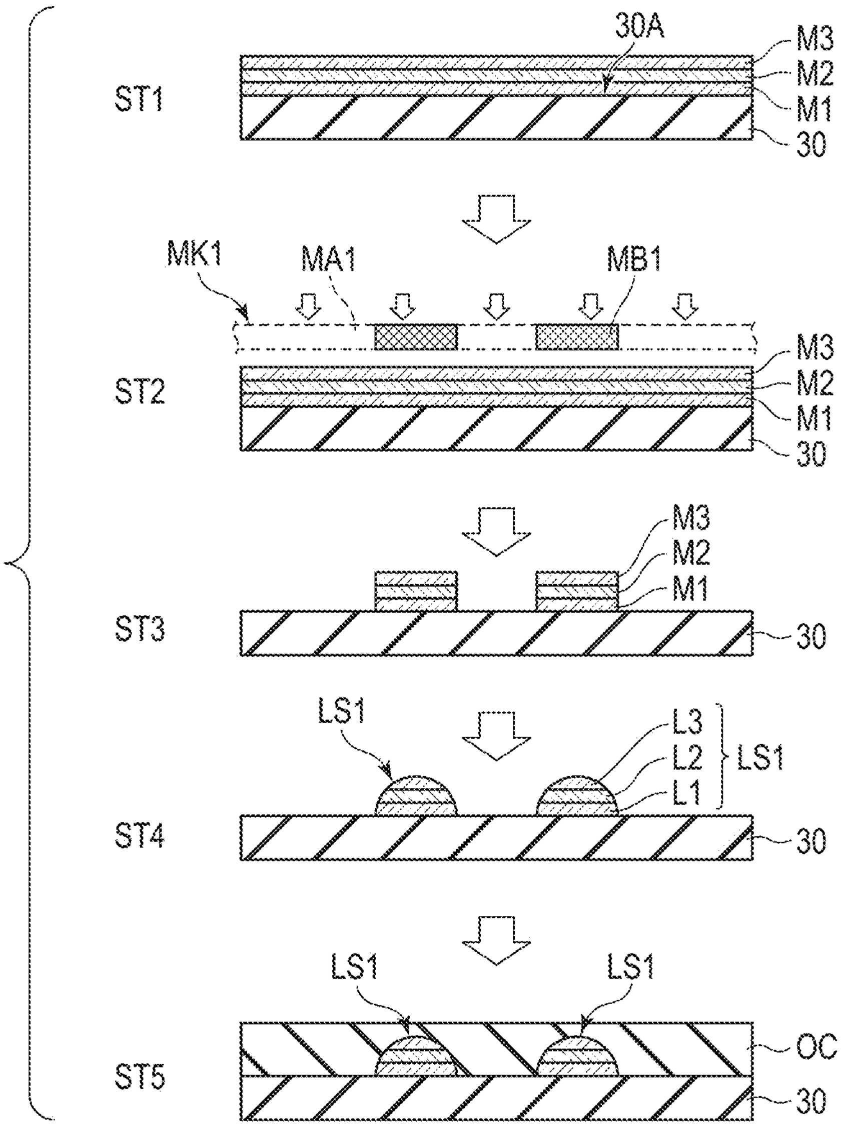
FIG. 8 is a diagram for explaining the manufacturing method of the first lenses LS1.

First, as shown in FIG. 8, the first surface 30A of the support body 30 is washed in step ST1. For example, an oxygen plasma treatment can be applied to the washing process. The first surface 30A may be washed by using an organic solvent. Subsequently, material M1 for forming the first layer L1 of each first lens LS1 is applied to the first surface 30A of the support body 30. Material M1 is a material having the first refractive index, and is, for example, an organic material such as silicone resin. As an example of silicone resin, polydimethyl siloxane (PDMS) can be applied.

Subsequently, material M2 for forming the second layer L2 of each first lens LS1 is applied to the upper side of material M1. Material M2 is a material having the second refractive index which is higher than the first refractive index, and is, for example, an organic material such as acrylic resin. As an example of acrylic resin, polymethyl methacrylate resin (PMMA) can be applied.

Subsequently, material M3 for forming the third layer L3 of each first lens LS1 is applied to the upper side of material M2. Material M3 is a material having the third refractive index which is higher than the second refractive index, and is, for example, an organic material such as epoxy resin.

Subsequently, materials M1, M2 and M3 are patterned in block to form the first lenses LS1.

In step ST2, mask MK1 is provided above material M3, and ultraviolet rays are emitted. Mask MK1 has aperture portions MA1 and shield portions MB1. When materials M1, M2 and M3 are positive sensitive materials, the shield portions MB1 are provided at the positions where the first lenses LS1 are formed. When materials M1, M2 and M3 are negative sensitive materials, the aperture portions MA1 are provided at the positions where the first lenses LS1 are formed.

Subsequently, in step ST3, materials M1, M2 and M3 are developed, and the areas irradiated with ultraviolet rays are removed.

Subsequently, materials M1, M2 and M3 left by patterning are subjected to reflowing in step ST4. By this process, the hemispherical first lenses LS1 are formed. The first lenses LS1 of subpixels SP1, SP2 and SP3 are formed at the same time by the above process.

Subsequently, the overcoat layer OC which covers the first lenses LS1 is formed in step ST5.

Figure 9A:
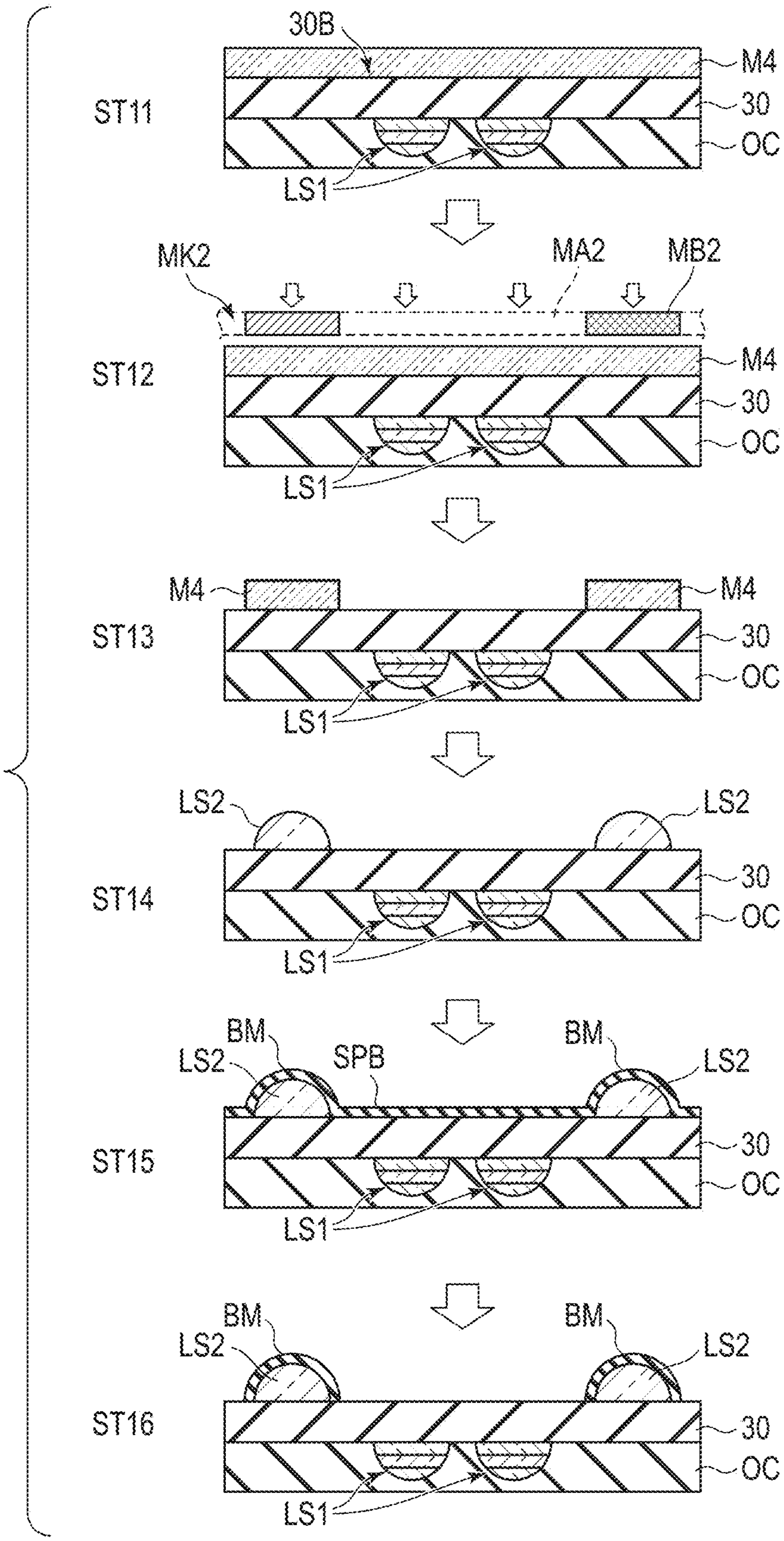
FIG. 9A is a diagram for explaining the manufacturing method of the second lenses LS2.

Subsequently, as shown in FIG. 9A, material M4 for forming the second lenses LS2 is applied to the second surface 30B of the support body 30 in step ST11. Material M4 is, for example, an organic material.

Subsequently, in step ST12, mask MK2 is provided above material M4, and ultraviolet rays are emitted. Mask MK2 has aperture portions MA2 and shield portions MB2. When material M4 is a positive sensitive material, the shield portions MB2 are provided at the positions where the second lenses LS2 are formed. When material M4 is a negative sensitive material, the aperture portions MA2 are provided at the positions where the second lenses LS2 are formed.

Subsequently, in step ST13, material M4 is developed, and the areas irradiated with ultraviolet rays are removed.

Subsequently, the remaining material M4 is subjected to reflowing in step ST14. By this process, the hemispherical second lenses LS2 are formed at positions which do not overlap the first lenses LS1.

Subsequently, the light-shielding layer BM which covers the second surface 30B and the second lenses LS2 is formed in step ST15.

Subsequently, the light-shielding layer BM is patterned in step ST16.

Figure 9B:
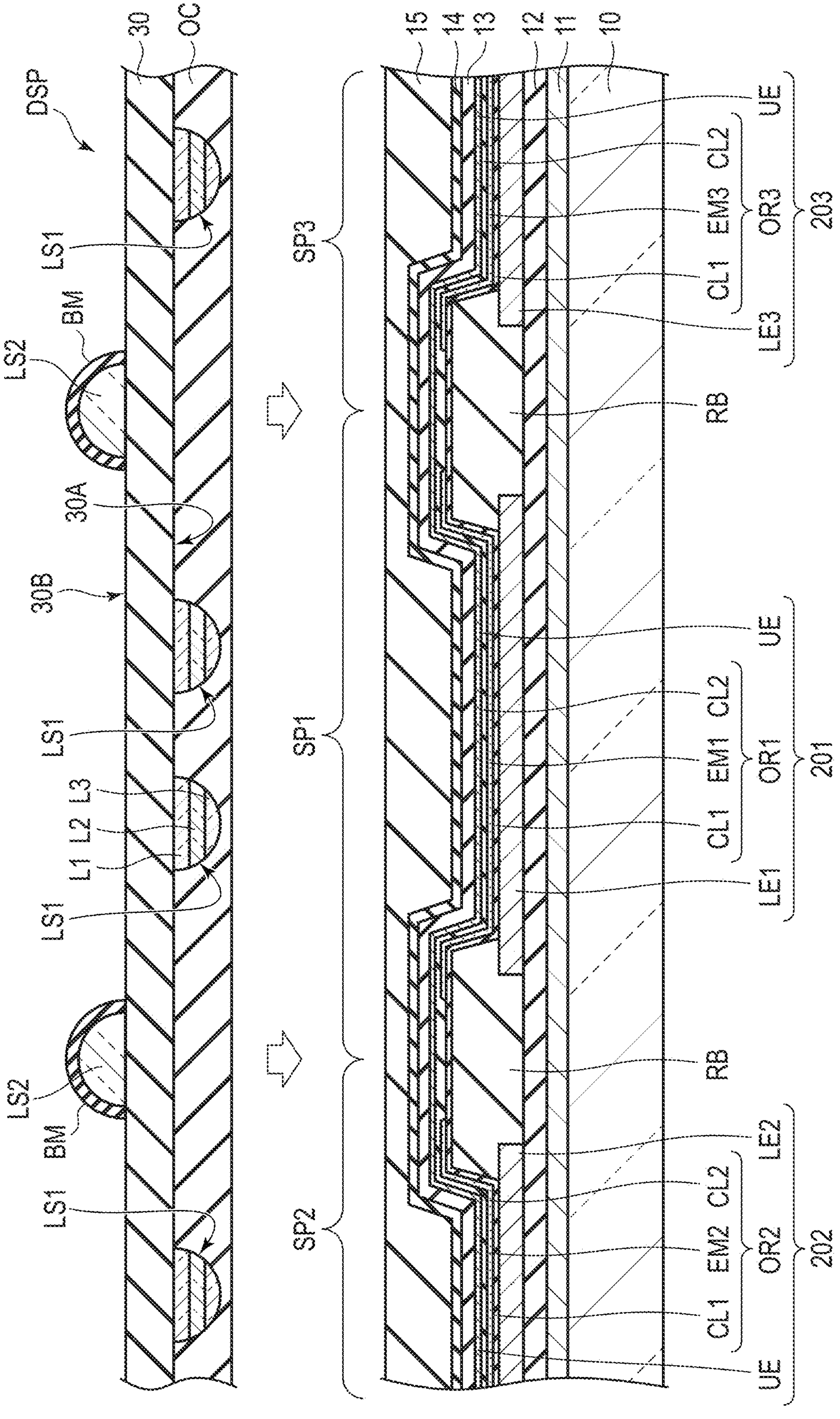
FIG. 9B is a diagram for explaining the manufacturing method of the display device DSP.

Subsequently, as shown in FIG. 9B, the overcoat layer OC is attached to the insulating layer 15. At this time, the first lenses LS1 are provided immediately above the display elements 201, 202 and 203. The second lenses LS2 are provided immediately above the rib RB. By this process, the display device DSP shown in FIG. 5 is manufactured.

In the above example, the first lenses LS1 are formed by patterning the first, second and third layers L1, L2 and L3 in block. However, the formation method is not limited to this example.

Figure 10:
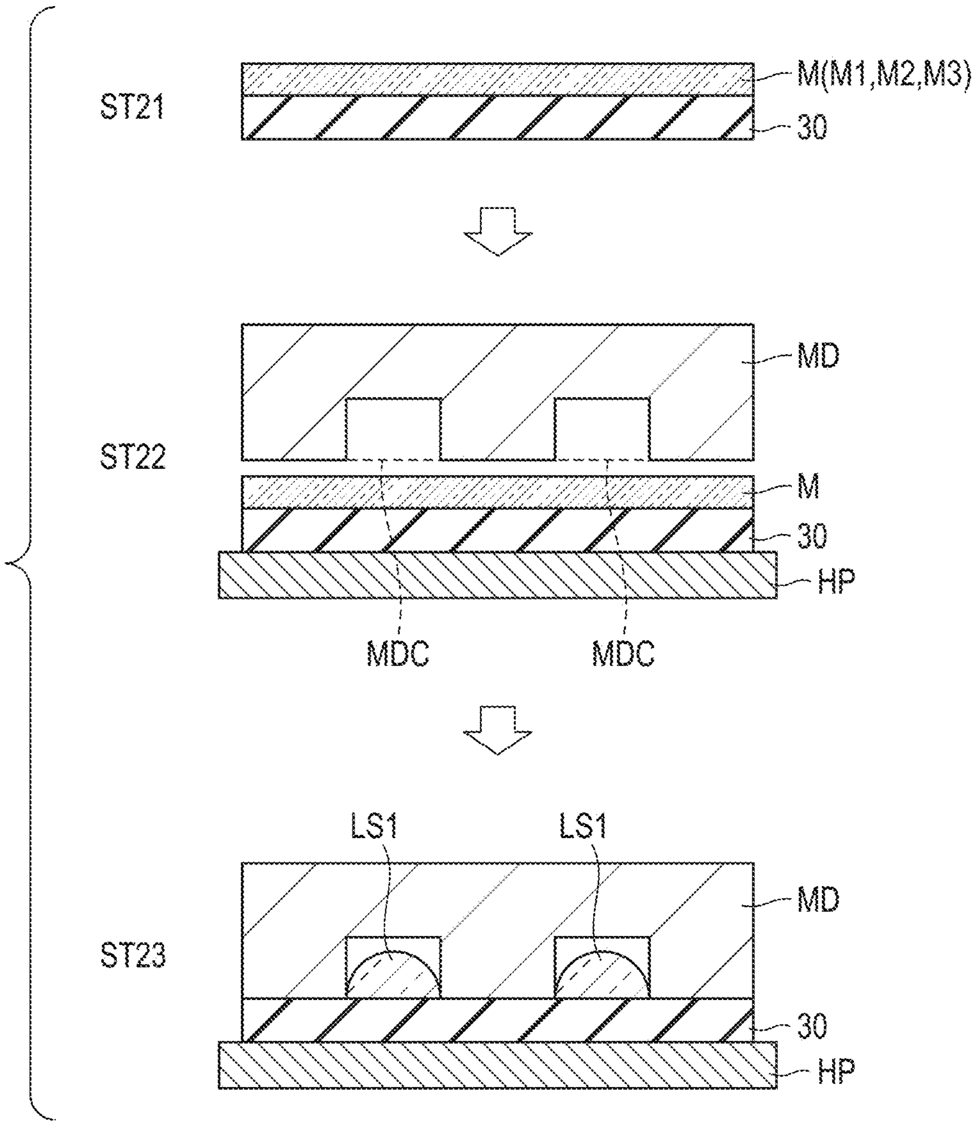
FIG. 10 is a diagram for explaining another method for forming the first lenses LS1.

FIG. 10 is a diagram for explaining another method for forming the first lenses LS1.

First, in step ST21, material M1 for forming the first layer L1 is applied, and material M2 for forming the second layer L2 is applied, and material M3 for forming the third layer L3 is applied. In FIG. 10, the multilayer body of materials M1, M2 and M3 is shown as material M.

Subsequently, a mold MD is prepared in step ST22. The mold MD has recess portions MDC corresponding to the first lenses LS1. Subsequently, the support body 30 is provided on a heating plate HP, and the mold MD is provided above material M. At this time, the recess portions MDC face material M.

Subsequently, in step ST23, material M is heated by the heating plate HP, and the mold MD is pressed from the upper side of material M. By this process, material M2 is melted and gets into the recess portions MDC. Thus, the convex first lenses LS1 are formed.

Although this specification explains another method for forming the first lenses LS1 above, the method explained here can be applied as another method for forming the second lenses LS2.

Now, another configuration example is explained.

Figure 11:
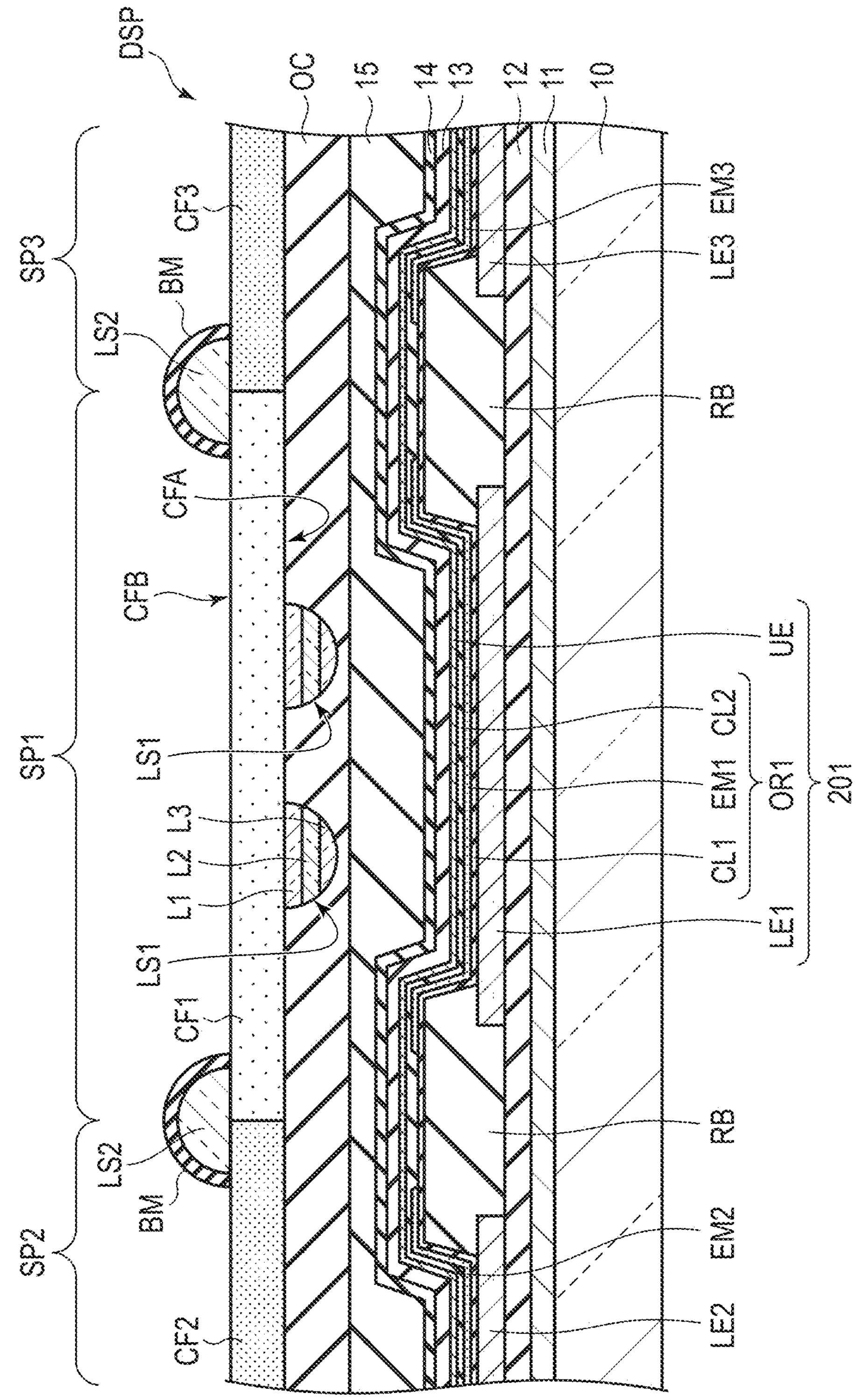
FIG. 11 is a cross-sectional view showing another configuration example of the display device DSP.

FIG. 11 is a cross-sectional view showing another configuration example of the display device DSP.

The configuration example shown in FIG. 11 is different from that shown in FIG. 5 in respect that the support body 30 is the color filters CF1, CF2 and CF3. For example, in subpixel SP1, the color filter CF1 has a first surface CFA which faces the display element 201, and a second surface CFB on a side opposite to the first surface CFA. The first lenses LS1 are provided on the first surface CFA immediately above the lower electrode LE1 and are formed into a convex shape toward the display element 201. The second lenses LS2 are provided on the second surface CFB immediately above the rib RB and are formed into a convex shape on a side opposite to the first lenses LS1. The light-shielding layer BM is provided immediately above the rib RB and covers the second lenses LS2.

In this configuration example, effects similar to those of the configuration example described above are obtained.

It should be noted that the support body 30 may be provided separately from the color filters CF1, CF2 and CF3.

As explained above, the embodiments can provide a display device in which the light extraction efficiency is improved and the reflection of external light can be prevented, and a manufacturing method thereof.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A display device comprising:

a substrate;

a lower electrode provided above the substrate;

a rib which covers a peripheral portion of the lower electrode;

an organic layer provided on the lower electrode and including a light emitting layer;

an upper electrode provided on the organic layer;

a support body provided above the upper electrode and having a first surface which faces the lower electrode, and a second surface on a side opposite to the first surface;

a first lens provided on the first surface immediately above the lower electrode and formed into a convex shape;

an overcoat layer which covers the first lens;

a second lens provided on the second surface immediately above the rib and formed into a convex shape; and a light-shielding layer which covers the second lens, wherein the first lens comprises at least a first layer which is in contact with the first surface and has a first refractive index, and a second layer which has a second refractive index higher than the first refractive index and overlaps the first layer.

2. The display device of claim 1, wherein the first lens further comprises a third layer which has a third refractive index higher than the second refractive index and overlaps the second layer.

3. The display device of claim 2, wherein an outer edge of the first layer, an outer edge of the second layer and an outer edge of the third layer are formed concentrically in plan view.

4. The display device of claim 2, wherein each of the first layer, the second layer and the third layer is formed of an organic material.

5. The display device of claim 1, wherein the second lens is formed of an organic material.

6. The display device of claim 1, further comprising:

a cap layer provided on the upper electrode;

a sealing layer provided on the cap layer and formed of an inorganic material; and an insulating layer provided on the sealing layer and formed of an organic material, wherein the overcoat layer is attached to the insulating layer.

7. The display device of claim 1, wherein the support body is a color filter.

8. A manufacturing method of a display device, comprising:

forming a first lens on a first surface of a support body;

covering the first lens with an overcoat layer;

forming a second lens on a second surface of the support body;

forming a light-shielding layer which covers the second lens; and attaching the overcoat layer to an insulating layer provided above a display element, wherein the forming the first lens includes at least:

forming a first layer on the first surface by using a material having a first refractive index; and forming a second layer on the first layer by using a material having a second refractive index which is higher than the first refractive index.

9. The manufacturing method of claim 8, wherein the second lens is formed at a position which does not overlap the first lens.

10. The manufacturing method of claim 8, wherein the first lens is provided immediately above the display element, and the second lens is provided immediately above a rib which surrounds the display element.

11. The manufacturing method of claim 8, wherein the forming the first lens includes patterning the first layer and the second layer in block.

12. The manufacturing method of claim 8, wherein the forming the first lens includes heating the first layer and the second layer, and pressing a mold having a recess portion from an upper side of the second layer.

13. The manufacturing method of claim 8, wherein the forming the first lens further includes:

forming a third layer on the second layer by using a material having a third refractive index which is higher than the second refractive index; and patterning the first layer, the second layer and the third layer in block.

14. The manufacturing method of claim 8, wherein the forming the first lens further includes:

forming a third layer on the second layer by using a material having a third refractive index which is higher than the second refractive index; and heating the first layer, the second layer and the third layer, and pressing a mold having a recess portion from an upper side of the third layer.

15. The manufacturing method of claim 8, wherein each of the first lens and the second lens is formed of an organic material.

* * * * *